(12) United States Patent
Clark

(10) Patent No.: US 12,469,696 B2
(45) Date of Patent: Nov. 11, 2025

(54) METHOD OF FORMING 3-DIMENSIONAL SPACER

(71) Applicant: Tokyo Electron Limited, Tokyo (JP)

(72) Inventor: Robert D. Clark, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 479 days.

(21) Appl. No.: 17/893,796

(22) Filed: Aug. 23, 2022

(65) Prior Publication Data

US 2023/0061683 A1 Mar. 2, 2023

Related U.S. Application Data

(60) Provisional application No. 63/239,837, filed on Sep. 1, 2021.

(51) Int. Cl.
*H01L 21/02* (2006.01)
*H01L 21/311* (2006.01)

(52) U.S. Cl.
CPC .... *H01L 21/0228* (2013.01); *H01L 21/02164* (2013.01); *H01L 21/0217* (2013.01); *H01L 21/02255* (2013.01); *H01L 21/31116* (2013.01)

(58) Field of Classification Search
CPC ........... H01L 21/0228; H01L 21/02164; H01L 21/0217; H01L 21/02255; H01L 21/31116
See application file for complete search history.

(56) References Cited

U.S. PATENT DOCUMENTS

| | | |
|---|---|---|
| 8,569,158 B2 | 10/2013 | Clark |
| 8,580,664 B2 | 11/2013 | Clark |
| 8,877,620 B2 | 11/2014 | Clark |
| 9,012,316 B2 | 4/2015 | Clark |
| 9,899,224 B2 | 2/2018 | Consiglio et al. |
| 9,978,649 B2 | 5/2018 | Clark et al. |
| 10,777,469 B2 * | 9/2020 | Bao ........................ H10D 62/151 |
| 2010/0062592 A1 | 3/2010 | Clark |
| 2016/0225659 A1 * | 8/2016 | Jacob ................... H10D 30/024 |
| 2017/0110321 A1 | 4/2017 | Cheng et al. |

(Continued)

OTHER PUBLICATIONS

International Searching Authority, "Notification of Transmittal of The International Search Report and The Written Opinion of The International Searching Authority, or the Declaration," International application No. PCT/US2022/041319, date of mailing Dec. 13, 2022, 10 pages.

*Primary Examiner* — Zandra V Smith
*Assistant Examiner* — Andre C Stevenson
(74) *Attorney, Agent, or Firm* — Slater Matsil, LLP

(57) ABSTRACT

A method of processing a substrate that includes: loading the substrate having a raised feature with at least two sidewalls exposed in a processing chamber; depositing a first layer over the substrate to cover a first portion of the two sidewalls; depositing a second layer over the first layer to cover a second portion of the two sidewalls; depositing a third layer over the second layer and the raised feature to cover a third portion of the sidewalls and a top surface of the raised feature; performing an anisotropic dry etching that removes portions of the second layer and the third layer, a remainder of the second layer forming a second sidewall spacer and a remainder of the third layer forming a third sidewall spacer; and performing an isotropic etching that selectively removes the second sidewall spacer to expose portions of the sidewalls of the raised feature.

17 Claims, 14 Drawing Sheets

(56) References Cited

U.S. PATENT DOCUMENTS

| | | |
|---|---|---|
| 2018/0040516 A1 | 2/2018 | Pandey et al. |
| 2018/0108526 A1* | 4/2018 | Mitard ................. H10D 62/121 |
| 2018/0114731 A1 | 4/2018 | Jeong et al. |
| 2019/0267448 A1 | 8/2019 | Weber et al. |
| 2020/0211901 A1 | 7/2020 | Clendenning et al. |
| 2022/0336677 A1* | 10/2022 | Liu .................... H10D 30/6735 |

* cited by examiner

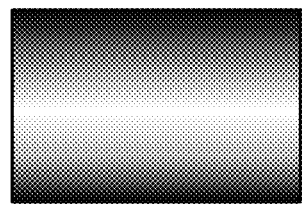 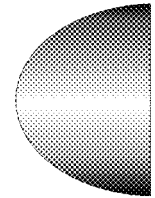
FIG. 19A     FIG. 19B
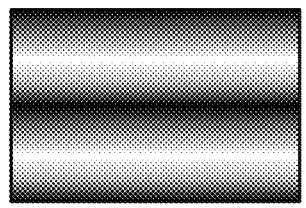 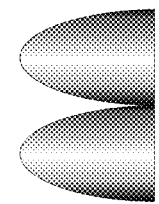
FIG. 19C     FIG. 19D
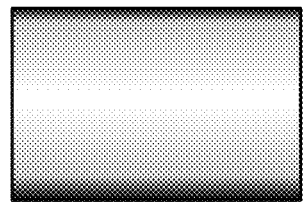 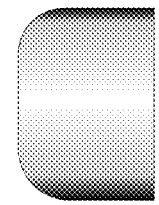
FIG. 19E     FIG. 19F

METHOD OF FORMING 3-DIMENSIONAL SPACER

CROSS-REFERENCE TO RELATED APPLICATIONS

This application claims the benefit of U.S. Provisional Application No. 63/239,837, filed on Sep. 1, 2021, which application is hereby incorporated herein by reference.

TECHNICAL FIELD

The present invention relates generally to methods of semiconductor manufacturing, and, in particular embodiments, to methods of forming a 3-dimensional spacer.

BACKGROUND

The semiconductor industry is characterized by a trend toward fabricating larger and more complex circuits on a given semiconductor chip. The larger and more complex circuits are achieved by reducing the size of individual devices within the circuits and spacing the devices closer together. As the dimensions of the individual components within a device such as a metal oxide semiconductor (MOS) or bipolar transistor are reduced and the device components brought closer together, improved electrical performance can be obtained. However, attention must be given to the formation of doped regions in the substrate to insure that deleterious electrical field conditions do not arise.

SUMMARY

In accordance with an embodiment of the present invention, a method of processing a substrate that includes: loading the substrate in a processing chamber, the substrate having a raised feature with at least two sidewalls exposed on a surface of the raised feature; depositing a first layer over the substrate adjacent the raised feature, the first layer covering a first portion of the two sidewalls; depositing a second layer over the first layer adjacent the raised feature, the second layer covering a second portion of the two sidewalls, where the first layer and the second layer include different materials; depositing a third layer over the second layer and the raised feature, the third layer covering a third portion of the sidewalls and a top surface of the raised feature, where the second layer and the third layer include different materials; performing an anisotropic dry etching that removes portions of the second layer and the third layer, a remainder of the second layer forming a second sidewall spacer and a remainder of the third layer forming a third sidewall spacer; and performing an isotropic etching that selectively removes the second sidewall spacer to expose portions of the sidewalls of the raised feature.

In accordance with an embodiment of the present invention, a method of forming a 3D spacer for a semiconductor device that includes: loading a substrate having a raised feature in a processing chamber, the raised feature including two exposed sidewalls; depositing a first dielectric material over the substrate adjacent the raised feature to cover a first portion of the sidewalls; depositing a second dielectric material over the first dielectric material adjacent the raised feature to cover a second portion of the sidewalls; depositing a third dielectric material over the second dielectric material adjacent the raised feature to cover a third portion of the sidewalls; forming a layer stack by repeating steps of depositing the second dielectric material and depositing the third dielectric material; performing an anisotropic dry etching that etches portions of the layer stack to form second sidewall spacers including the first dielectric material and third sidewall spacers including the third dielectric material; selectively removing the second sidewall spacers to expose portions of the sidewalls of the raised feature; conformally depositing a dopant layer on the raised feature, the dopant layer being in physical contact with the exposed portions of the sidewalls of the raised feature; and heating the substrate to form a doped region in the raised feature by diffusion of a dopant from the dopant layer into the raised feature.

In accordance with an embodiment of the present invention, a method of processing a substrate that includes: loading the substrate in a processing chamber, the substrate having a raised feature with at least two sidewalls exposed on a surface of the raised feature; depositing a first layer over the substrate adjacent the raised feature, the first layer covering a first portion of the two sidewalls; depositing a second layer over the first layer adjacent the raised feature, the second layer covering a second portion of the two sidewalls, where the first layer and the second layer include different materials; depositing a third layer, using atomic layer deposition (ALD), over the second layer, the third layer covering a third portion of the sidewalls, the third layer having a varying chemical composition that changes in a vertical direction normal to a major surface of the substrate; performing an anisotropic dry etching that removes portions of the second layer and the third layer, a remainder of the second layer forming a second sidewall spacer and a remainder of the third layer forming a third sidewall spacer; and performing an isotropic etching that removes the second sidewall spacer and a portion of the third sidewall spacer to expose portions of the sidewalls of the raised feature.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1-8 schematically illustrate through cross-sectional views formation of a 3D spacer and ultra-shallow doping regions according to an embodiment, wherein FIG. 1 illustrates an incoming substrate having a raised feature, FIG. 2 illustrates the substrate after depositing two layers surrounding the raised feature, FIG. 3 illustrates the substrate after depositing a third layer to cover the raised feature, FIG. 4 illustrates the substrate after an anisotropic dry etch process, FIG. 5 illustrates the substrate after an isotropic etch, FIG. 6 illustrates the substrate after depositing a dopant layer, FIG. 7 illustrates the substrate after a thermal treatment for solid state diffusion, and FIG. 8 illustrates the substrate after removing the remainder of the dopant layer;

FIGS. 9-14 schematically illustrate through cross-sectional views formation of a plurality of 3D spacers and ultra-shallow doping regions according to another embodiment, wherein FIG. 9 illustrates an incoming substrate having a raised feature covered by alternating layers, FIG. 10 illustrates the substrate after an anisotropic dry etch process, FIG. 11 illustrates the substrate after an isotropic etch, FIG. 12 illustrates the substrate after depositing a dopant layer, FIG. 13 illustrates the substrate after a thermal treatment for solid state diffusion, and FIG. 14 illustrates the substrate after removing the remainder of the dopant layer;

FIGS. 16-18 schematically illustrate through cross-sectional views formation of a plurality of 3D spacers according to yet another embodiment, wherein FIG. 16 illustrates an incoming substrate having some layers with gradients in chemical composition, FIG. 17 illustrates the substrate after formation of the 3D spacers with varying thickness, and FIG. 18 illustrates the substrate after a subsequent etching process;

FIGS. 19A-19F schematically illustrate through cross-sectional views examples of gradient in chemical composition for 3D spacers according to various embodiments, wherein FIG. 19A illustrates an initial layer deposited accordingly to one embodiment, FIG. 19B illustrates a resulting shape of a 3D spacer from FIG. 19A, FIG. 19C illustrates an initial layer deposited accordingly to another embodiment, FIG. 19D illustrates a resulting shape of a 3D spacer from FIG. 19C, FIG. 19E illustrates an initial layer deposited accordingly to yet another embodiment, FIG. 19F illustrates a resulting shape of a 3D spacer from FIG. 19E; and FIGS. 20A-20C illustrate process flow charts of methods of forming a 3D spacer in accordance with various embodiments, wherein FIG. 20A illustrates an embodiment, FIG. 20B illustrates another embodiment, and FIG. 20C illustrates an alternate embodiment.

DETAILED DESCRIPTION OF ILLUSTRATIVE EMBODIMENTS

Figure 1:
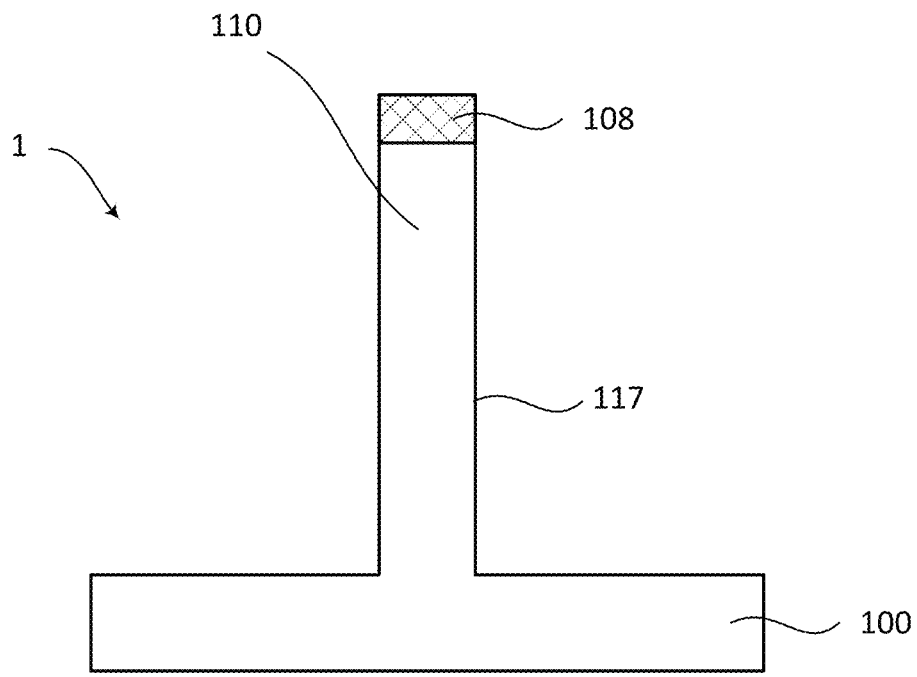

This application relates to a method of processing a substrate, more particularly to forming a 3-dimensional (3D) spacer. As the size of device components such as the transistor gate in an MOS device and the emitter region in a bipolar device, are reduced, the junction depth of doped regions formed in the semiconductor substrate must also be reduced. The formation of shallow junctions having a uniform doping profile and a high surface concentration has proven to be very difficult. A commonly used technique is to implant dopant atoms into the substrate with an ion implantation apparatus. Using ion implantation, the high energy dopant atoms bombard the surface of the substrate at high velocity and are driven into the substrate. While this method has proven effective for the formation of doped regions having moderately deep junctions, the formation of ultra-shallow junctions using ion implantation is extremely difficult. Both the path of the energized dopant atoms within the substrate and the implant uniformity are difficult to control at the low energies necessary to form shallow implanted junctions. The implantation of energized dopant atoms damages the crystal lattice in the substrate that is difficult to repair. Dislocations resulting from the lattice damage can easily spike across a shallow junction giving rise to current leakage across the junction. Moreover, the implantation of p-type dopants such as boron, which diffuse rapidly in silicon, results in excessive dispersion of dopant atoms after they are introduced into the substrate. It then becomes difficult to form a highly confined concentration of p-type dopant atoms in a specified area in the substrate and especially at the surface of the substrate.

In addition, new device structures for transistors and memory devices are being implemented that utilize doped three-dimensional structures. Examples of such devices include, but are not limited to, FinFETs, tri-gate FETs, recessed channel transistors (RCATs), and embedded dynamic random access memory (EDRAM) trenches. In order to dope these structures uniformly it is desirable to have a doping method that is conformal. Ion implant processes are effectively line of site and therefore require special substrate orientations to dope fin and trench structures uniformly. In addition, at high device densities, shadowing effects make uniform doping of fin structures extremely difficult or even impossible by ion implant techniques. Conventional plasma doping and atomic layer doping are technologies that have demonstrated conformal doping of 3-dimensional semiconductor structures, but each of these is limited in the range of dopant density and depth that can be accessed under ideal conditions.

Embodiments of the present invention provide a method for forming a doped vertical spacer on 3D structures of semiconductor devices. The methods can overcome several of the abovementioned difficulties, for example, through ultra-shallow doping regions in a vertical recess feature. Methods for forming ultra-shallow dopant regions in semiconductor devices by solid phase diffusion from a dopant layer into a raised feature on a substrate are disclosed in various embodiments. The dopant regions can, for example, include ultra-shallow dopant regions for FinFETs and tri-gate FETs. The methods provide a vertical spacer on 3D structures and allow etching and doping specific areas of raised features such as fins, pillars, or trenches defined by vertical or near vertical sidewalls. While the methods are primarily described for embodiments directed to ultra-shallow doping regions formed through solid state diffusion, in other embodiments, the methods for forming a 3D spacer may be applied for various other applications.

In the following, the methods for forming a 3D spacer and ultra-shallow doping regions are described referring to FIGS. 1-8 in accordance with one embodiment. Another embodiment for forming a plurality of 3D spacers is described referring to FIGS. 9-14. Further embodiments of the methods for a subsequent etch process using the 3D spacer as an etch mask are described referring to FIGS. 15-18. Example process flow diagrams are illustrated in FIG. 19A-19C. All figures in this disclosure are drawn for illustration purpose only and not to scale, including the aspect ratios of features.

FIGS. 1-8 schematically illustrate through cross-sectional views formation of a 3D spacer and ultra-shallow doping regions according to an embodiment.

FIG. 1 illustrates a schematic cross-sectional view of an incoming structure 1 containing a substrate 100 and a raised feature 110. In various embodiments, the substrate 100 may be a part of, or including, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed. The substrate 100 can be of any size, for example a 200 mm substrate, a 300 mm substrate, or an even larger substrate. According to one embodiment, the substrate 100 and the raised feature 110 can contain Si, for example crystalline Si, polycrystalline Si, or amorphous Si. In one example, the substrate 100 can be a tensile-strained Si layer. According to another embodiment, the substrate 100 may contain Ge or $Si_xGe_{1-x}$ compounds, where x is the atomic fraction of Si, 1-x is the atomic fraction of Ge, and $0<x<1$. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 100 may be a compressive-strained Ge layer or a tensile-strained $Si_xGe_{1-x}$ (x>0.5) deposited on a relaxed $Si_{0.5}Ge_{0.5}$ buffer layer. According to some embodiments, the substrate 100 can include a silicon-on-insulator (SOI). Further, the substrate 100 may include compound semiconductors such as GaAs, GaN, InP, InSb, InAs, InGaAs, and InGaSb. In various embodiments, the substrate 100 is patterned or embedded in other components of the semiconductor device.

Still referring to FIG. 1, the raised feature 110 may comprise a fin structure with a height between 50 nm and 60 nm and a width between 3 nm and 8 nm, but in other embodiments other dimensions may be used. In certain embodiments, as illustrated in FIG. 1, an optional cap layer 108 may be located on the top of the raised feature 110. The cap layer 108 may, for example, be an oxide layer, a nitride layer, or oxynitride layer. In certain embodiments, the optional cap layer 108 may be a hardmask that has been used to fabricate the raised feature 110 and/or will be used in an anisotropic etch process during the formation of a 3D spacer. In one or more embodiments, the cap layer 108 may be 10-40 nm thick, but various thickness may be selected according to specific integration processes. Further, in various embodiments, the raised feature 110 has at least two sidewalls 117 exposed, where one or more 3D spacers may be formed by the steps described below.

Figure 2:
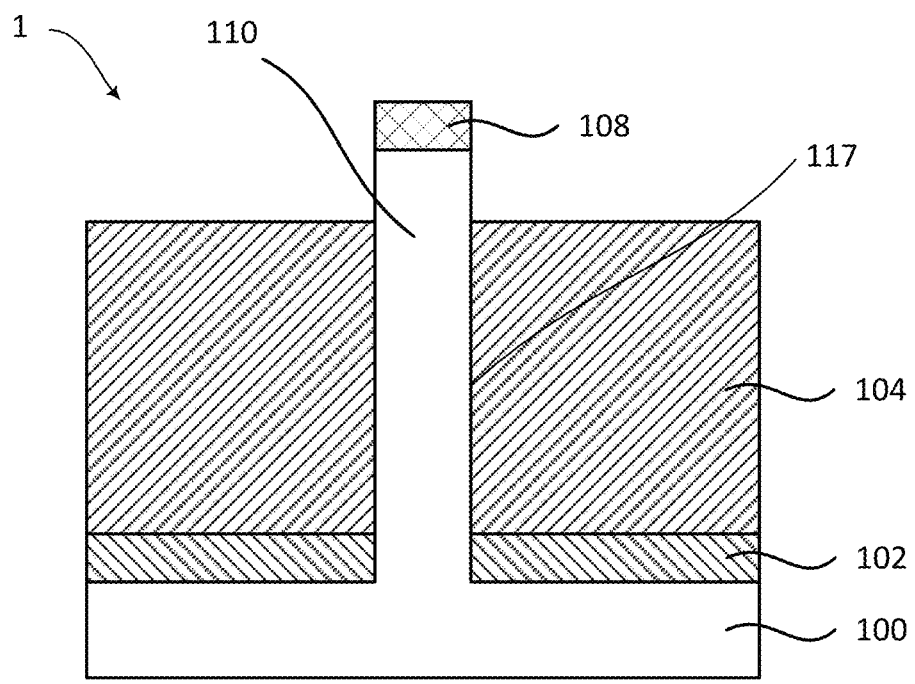

FIG. 2 illustrates the substrate 100 after depositing two layers surrounding the raised feature 110.

In FIG. 2, a first layer 102 may be deposited on the substrate 100 adjacent the raised feature 110. In various embodiments, the first layer 102 may cover a portion of the two sidewalls 117 near the bottom as illustrated in FIG. 2. The first layer 102 may be 10-50 nm thick, but in certain embodiments it may be thicker (e.g., 100 nm) when the raised feature 110 has a greater height than the first layer 102. According to some embodiments, the first layer 102 may include a dielectric layer. The dielectric layer can include silicon oxide, silicon nitride, silicon carbide, spin-on carbon, or a spin-on polymer. The first layer 102 may be deposited by chemical vapor deposition (CVD), plasma-enhanced CVD (PECVD), atomic layer deposition (ALD), plasma-enhanced ALD (PEALD), physical vapor deposition (PVD), sputtering, or wet processes such as spin coating, for example.

PECVD or PEALD may, for example, utilize a plasma generated by a low energy slot plane antenna array that reduces or prevents plasma damage to underlying layers and provides directional deposition of the first layer 102 (and subsequent layers) onto the substrate 100 adjacent the raised feature 110.

The deposition or growth of the first layer 102 on the substrate 100 relative to the sidewalls 117 of the raised feature 110 may be highly selective or directional. Accordingly, the first layer 102 may grow from the surface of the substrate 100 and only a portion of the sidewalls 117 at the bottom may be covered by the first layer 102.

FIG. 2 further illustrates a second layer 104 deposited on the first layer 102 adjacent the raised feature 110. The second layer 104 may be 10-50 nm thick in certain embodiments. The first layer 102 and the second layer 104 contain different materials in order to enable etch selectivity in a subsequent etch step. According to some embodiments, the second layer 104 may include a dielectric layer. The dielectric layer can include silicon oxide, silicon nitride, silicon carbide, spin-on carbon, or a spin-on polymer. In one example, a polymer doped with aluminum oxide may be used. The second layer 104 may be deposited by CVD, PECVD, ALD, PEALD, PVD, sputtering, or wet processes such as spin coating, for example. The deposition or growth of the second layer 104 on the first layer 102 relative to the sidewalls 117 of the raised feature 110 may be highly selective. Accordingly, only a portion of the sidewalls 117 may be covered by the second layer 104.

Figure 3:
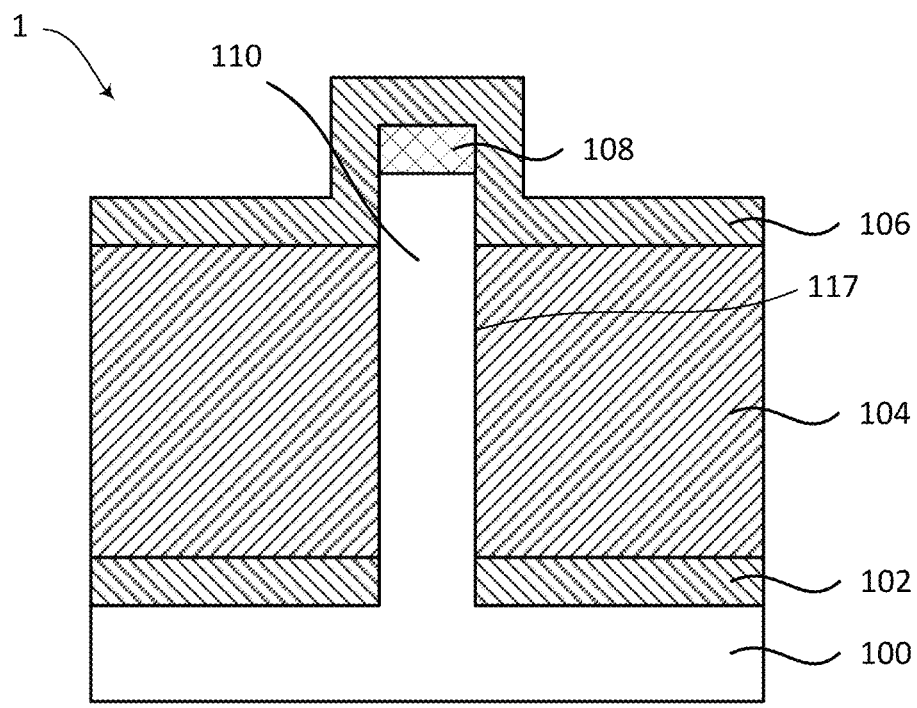

FIG. 3 illustrates the substrate 100 after depositing a third layer 106 to cover the raised feature 110.

In FIG. 3, the third layer 106 may be deposited on the second layer 104 and on the raised feature 110. The third layer 106 may be 5-10 nm thick in certain embodiments. The third layer 106 and the second layer 104 contain different materials in order to enable etch selectivity in a subsequent etch step. In one example, the third layer 106 and the first layer 102 contain the same or similar materials. According to some embodiments, the third layer 106 may include a dielectric layer. The dielectric layer can include silicon oxide, silicon nitride, silicon carbide, spin-on amorphous carbon, or a spin-on polymer. The third layer 106 may be deposited by CVD or ALD, for example. In contrast to the first layer 102 and the second layer 104, in certain embodiments, the deposition of the third layer 106 may be highly conformal over the raised feature 110. Accordingly, any remaining sidewalls 177 and the optional cap layer 108 may be entirely covered by the third layer 106, even if the height of the remaining sidewalls 117 and the optional cap layer is greater than the thickness of the third layer 106.

According to one embodiment, the first layer 102 contains silicon nitride and the second layer 104 contains silicon oxide. In one embodiment, the first layer 102 contains silicon nitride, the second layer 104 contains silicon oxide, and the third layer 106 contains silicon nitride. In one example, as further described later referring to FIGS. 9-14, one or more of the first layer 102, the second layer 104, and the third layer 106 may be epitaxially deposited or grown.

Figure 4:
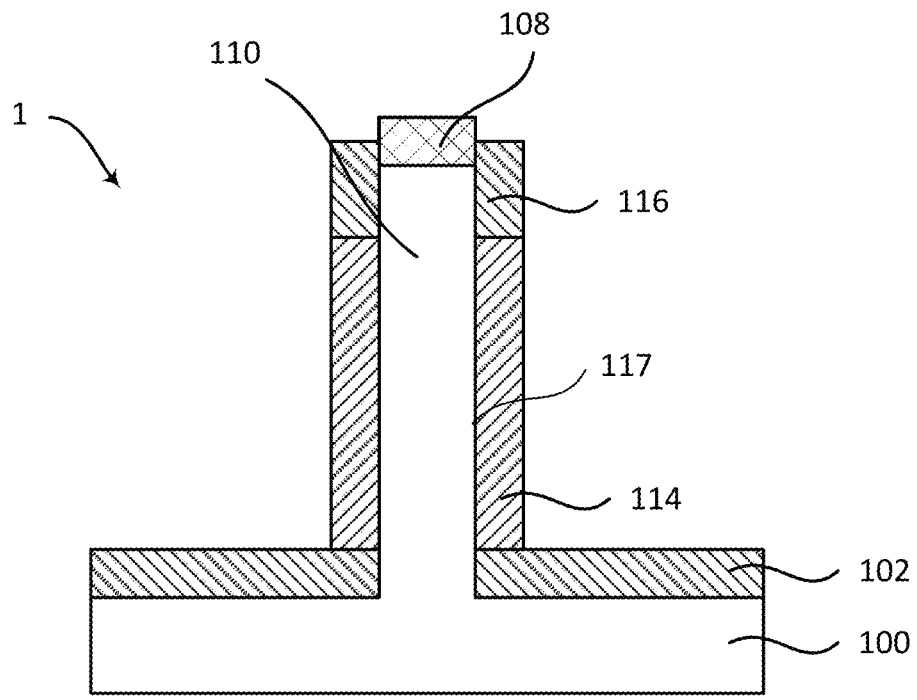

FIG. 4 illustrates the substrate 100 after an anisotropic dry etch process.

In FIG. 4, the anisotropic dry etching process may be performed to etch the second layer 104 and the third layer 106. Because of the anisotropy of the etching process, a major portion of the layers positioned over the top surface of the substrate 100 is removed, leaving a portion of the layers that adheres to the sidewalls 117. As a result, second sidewall spacers 114 may be formed from the second layer 104 and third sidewall spacers 116 from the third layer 106. In certain embodiments, the optional cap layer 108 may be used as an etch mask. In the embodiment depicted in FIG. 4, the anisotropic dry etching process terminates on the first layer 102. In another embodiment, although not illustrated, the anisotropic dry etching process may further etch the first layer 102 and terminate on the substrate 100. In one example, the anisotropic dry etching process can include plasma-excited fluorocarbon gas and oxygen gas. In order to effectively remove both the second layer 104 and the third layer 106, the anisotropic dry etching process may be a multi-step plasma etching process that involves multiple etch gas compositions.

Figure 5:
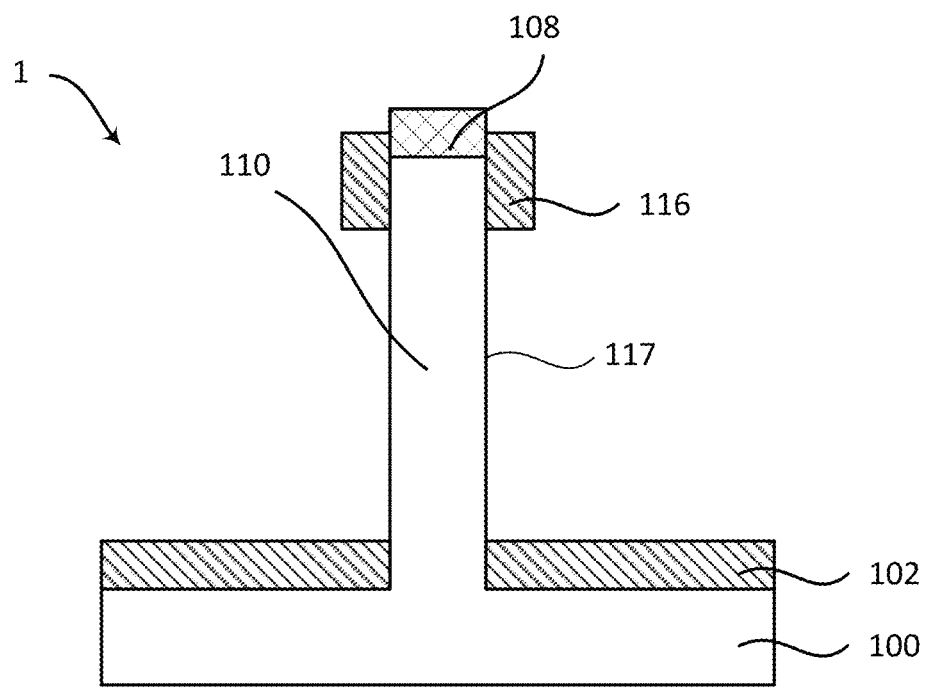

FIG. 5 illustrates the substrate 100 after an isotropic etch.

Figure 7:
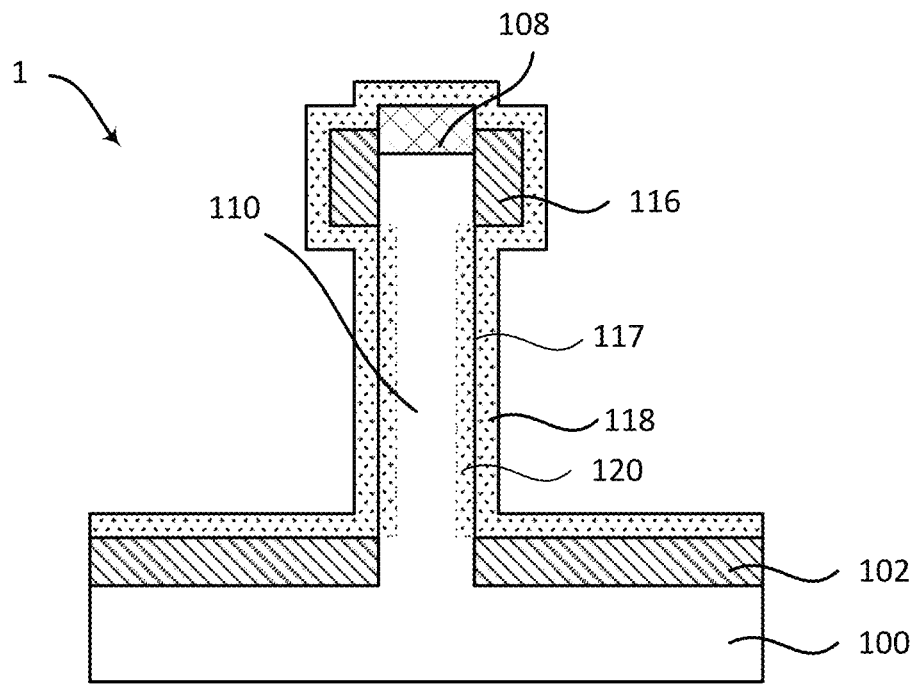
Figure 8:
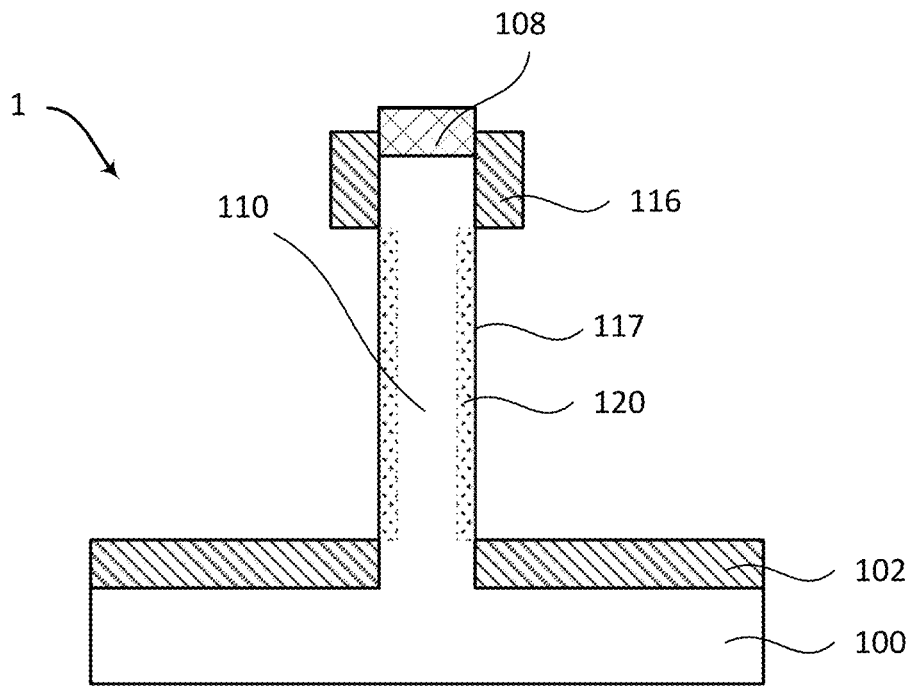

In FIG. 5, the isotropic etch may be performed to selectively remove the second sidewall spacers 114 from the structure 1. This results in exposing some portions of the sidewalls 117 of the raised feature 110 below the third sidewall spacers 116 and above the first layer 102. In one example, a wet etching process containing a HF solution can be used. In another embodiments, a dry etch process may be used. The third sidewall spacers 116 remaining after the isotropic etch are the 3D spacers that may be used in subsequent steps such as formation of ultra-shallow dopant regions (FIGS. 6-8).

Figure 6:
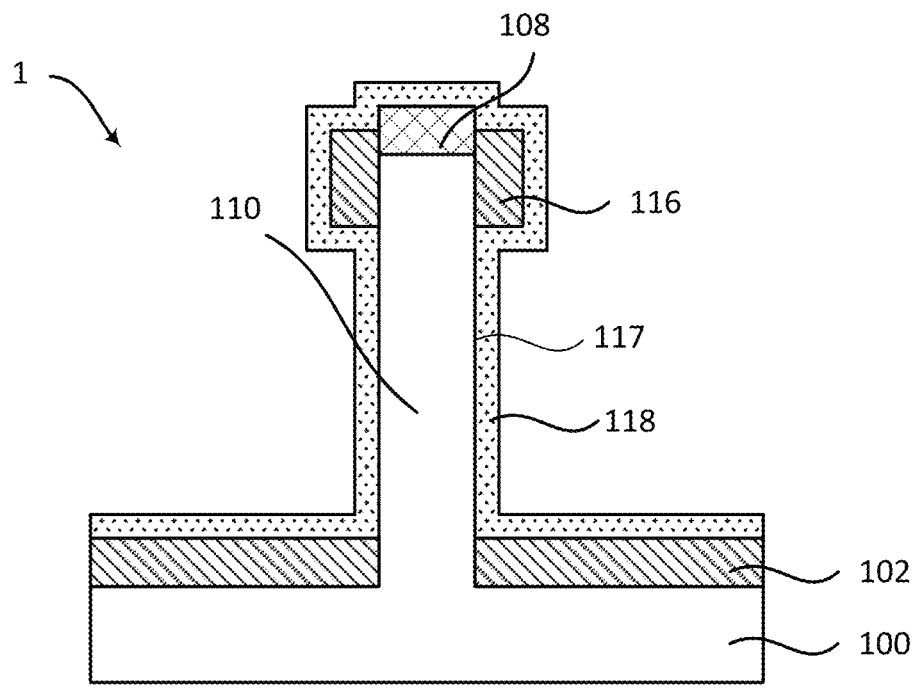

FIG. 6 illustrates the substrate 100 after depositing a dopant layer 118.

In FIG. 6, conformal deposition of the dopant layer 118 may be performed on the structure 1, including on the exposed portions of the sidewalls 117 of the raised feature 110. As depicted in FIG. 6, the dopant layer 118 can be in direct physical contact with the exposed sidewall 117. In some embodiments, the conformal dopant layer 118 may be deposited by CVD or ALD. The dopant layer 118 can include an oxide layer (e.g., $SiO_2$), a nitride layer (e.g., SiN), or an oxynitride layer (e.g., SiON), or a combination of two or more thereof. The dopant layer 118 can include one or more dopants from Group IIIA of the Periodic Table of the Elements: boron (B), aluminum (Al), gallium (Ga), indium (In), and thallium (Tl); and Group VA: nitrogen (N), phosphorous (P), arsenic (As), antimony (Sb), and bismuth (Bi). According to some embodiments, the dopant layer 118 can contain low dopant levels, for example between about 0.5 and about 5 atomic % dopant. According to other embodiments, the dopant layer 118 can contain medium dopant levels, for example between about 5 and about 20 atomic % dopant. According to yet other embodiments, the dopant layer 118 can contain high dopant levels, for example greater than 20 atomic % dopant. In some examples, a thickness of the dopant layer 118 can be 4 nanometers (nm) or less, for example between 1 nm and 4 nm, between 2 nm and 4 nm, or between 3 nm and 4 nm. However, other thicknesses may be used.

According to other embodiments, the dopant layer 118 can contain or consist of a doped high-k dielectric material in the form of an oxide layer, a nitride layer, or an oxynitride layer. The dopants in the high-k dielectric material may be selected from the list of dopants above. The high-k dielectric material can contain one or more metal elements selected from alkaline earth elements, rare earth elements, Group IIIA, Group IVA, and Group IVB elements of the Periodic Table of the Elements. Alkaline earth metal elements include beryllium (Be), magnesium (Mg), calcium (Ca), strontium (Sr), and barium (B a). Exemplary oxides include magnesium oxide, calcium oxide, and barium oxide, and combinations thereof. Rare earth metal elements may be selected from the group of scandium (Sc), yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). The Group IVB elements include titanium (Ti), hafnium (Hf), and zirconium (Zr). According to some embodiments of the invention, the high-k dielectric material may contain $HfO_2$, HfON, HfSiON, $ZrO_2$, ZrON, ZrSiON, $TiO_2$, TiON, $Al_2O_3$, $La_2O_3$, $W_2O_3$, $CeO_2$, $Y_2O_3$, or $Ta_2O_5$, or a combination of two or more thereof. However, other dielectric materials are contemplated and may be used.

FIG. 7 illustrates the substrate after a thermal treatment for solid state diffusion.

Thereafter, the structure 1 in FIG. 6 may be heat-treated to diffuse the dopant (e.g., B, Al, Ga, In, Tl, N, P, As, Sb, or Bi) from the dopant layer 118 into the raised feature 110 through the sidewalls 117 to form dopant regions 120. This is schematically shown in FIG. 7. In FIG. 7, two dopant regions 120 are illustrated on each of the two sides of the raised feature 110. The thermal treatment can include heating the structure 1 in an inert atmosphere (e.g., argon (Ar) or nitrogen ($N_2$)) or in an oxidizing atmosphere (e.g., oxygen ($O_2$) or water vapor ($H_2O$)) to a temperature between 100° C. and 1000° C. for between 10 sec and 10 min. In various embodiments, the temperature and gas environment for the thermal treatment may be selected so that the diffusion of the dopant may be optimized. In some examples, the thermal treatment may include rapid thermal annealing (RTA), a spike anneal, or a laser spike anneal.

In some examples, a thickness of the dopant region 120 can be between 1 nm and 10 nm or between 2 nm and 5 nm. However, those skilled in the art will readily realize that the lower boundary of the dopant region 120 may not be abrupt but rather characterized by gradual decrease in dopant concentration.

FIG. 8 illustrates the substrate after removing the remainder of the dopant layer 118.

Following the thermal treatment, any remnants of the dopant layer 118 may be removed using a dry etching process or a wet etching process. The resulting structure 1 is depicted in FIG. 8. Additionally, a dry or wet cleaning process may be performed to remove any etch residues from the structure 1 following the thermal treatment.

In the embodiments above (FIGS. 1-8), only a set of two 3D spacers (i.e., the third sidewall spacers 116 on both sides of the sidewalls 117) is described. In other embodiments, the methods may enable more than one set of 3D spacers along the sidewalls 117 may be formed.

FIGS. 9-14 schematically illustrate through cross-sectional views formation of a plurality of 3D spacers and ultra-shallow doping regions according to another embodiment. Various steps may follow the steps already described above in the prior embodiments, and thus some details of structure and processes will not be repeated.

Figure 9:
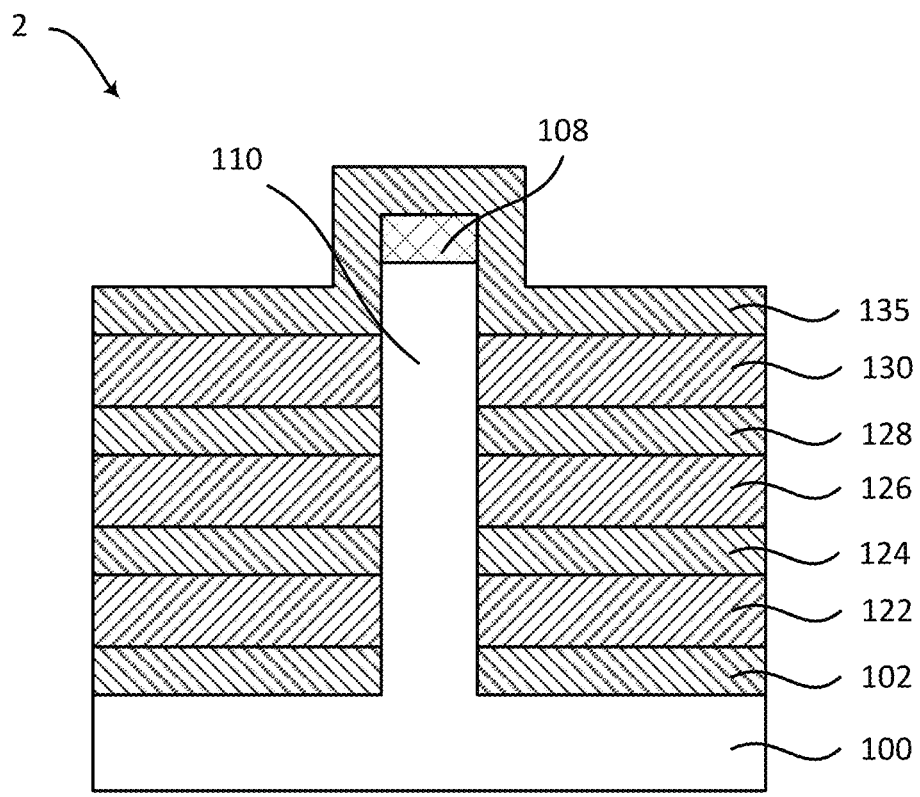

FIG. 9 illustrates a schematic cross-sectional view of a structure 2.

In FIG. 9, the structure 2 is similar to the structure 1 described in FIG. 1 and contains a substrate 100, a raised feature 110, an optional cap layer 108 located on the top of the raised feature 110, and a first layer 102 deposited on the substrate 100 adjacent the raised feature 110.

FIG. 9 further illustrates additional layers 122, 124, 126, 128, 130, and 135 deposited on the first layer 102. In various embodiments, each of these additional layers 122, 124, 126, 128, 130 may be 5-20 nm thick, but each of the layers 102, 122, 124, 126, 128, 130, and 135 may have a thickness different from each other. In one embodiment, second layers 122, 126 and 130 contain a second material, and third layers 124, 128 and 135 contain a third material. In general, the structure 2 may contain any number alternating second and third layers. The third material is different from the second material. In some examples, the second layers 122, 126 and 130 may contain the material of the second layer 104 in FIG. 2, and the third layers 124, 128 and 135 may contain the material of the third layer 106 in FIG. 2. In one example, the second layers 122, 126 and 130 contain silicon oxide and the third layers 124, 128 and 135 contain silicon nitride. In one embodiment, the first layer 102 may contain the material of the third layers 124, 128, 135. In various embodiments, this layer stack of the additional layers 122, 124, 126, 128, 130, and 135 may be formed by CVD or ALD, for example, and in certain embodiments, the process of forming the layer stack may also comprise multiple steps of deposition and etching.

Figure 10:
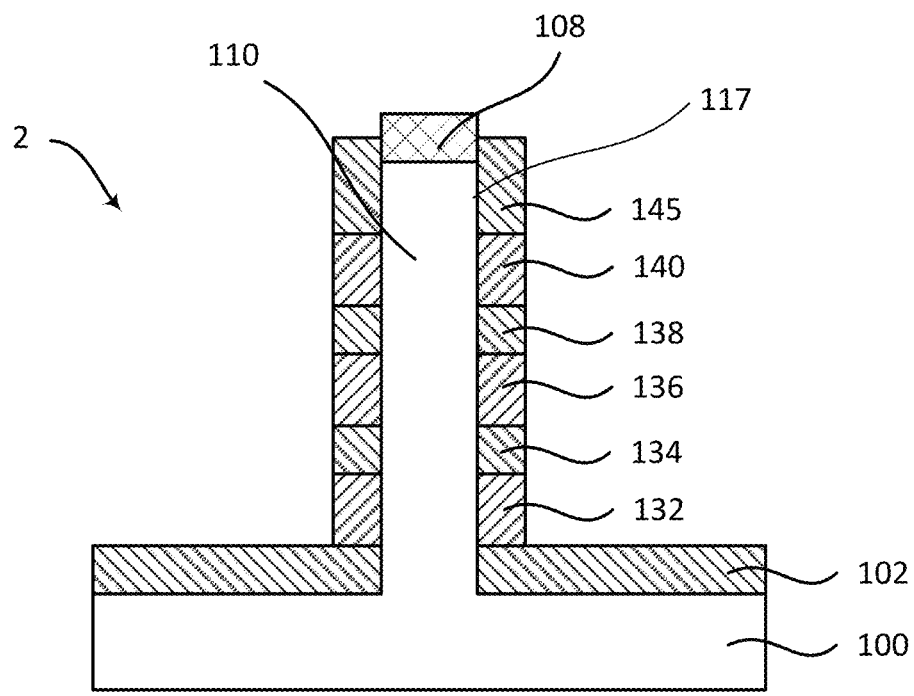

FIG. 10 illustrates the substrate 100 after an anisotropic dry etch process.

FIG. 10 illustrates the structure 2 following the anisotropic dry etching process. As described in the prior embodiments (FIG. 4), by removing a major portion of the layers 122, 124, 126, 128, 130, 135 except the portions on the sidewalls 117, the anisotropic dry etching process results in forming second sidewall spacers 132, 136 and 140 from the second layers 122, 126 and 130, and third sidewall spacers 134, 138 and 145 from the third layers 124, 128 and 135. In the embodiment depicted in FIG. 10, the anisotropic dry etching process terminates on the first layer 102, but in other embodiments, it may continue to etch through the first layer 102 and terminate on the substrate 100.

Figure 11:
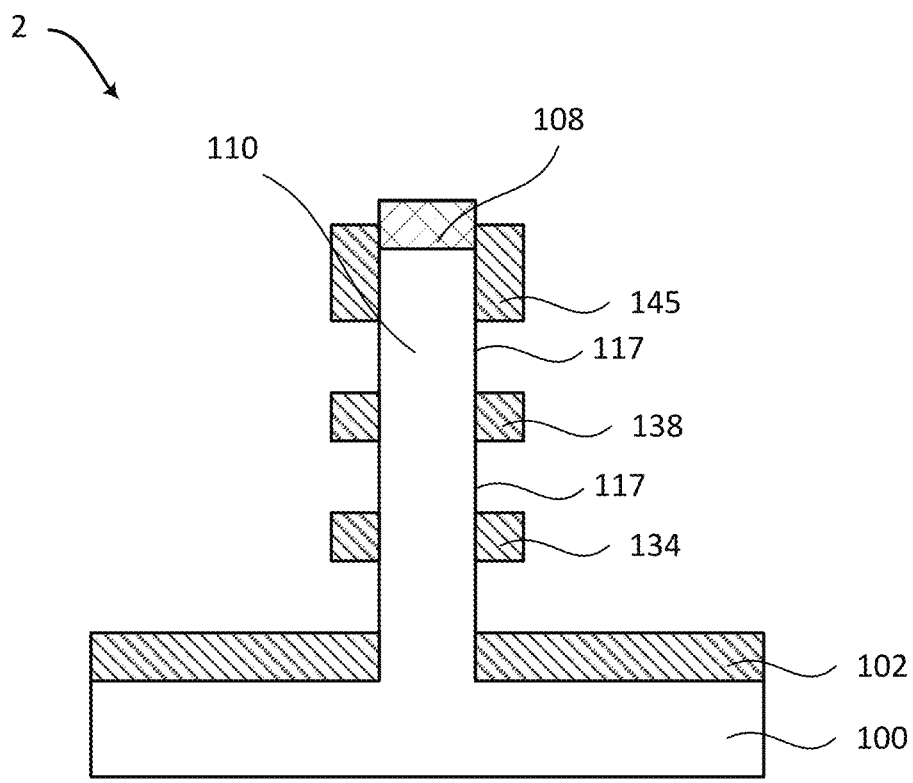

FIG. 11 illustrates the substrate 100 after an isotropic etch.

FIG. 11 illustrates the structure 2 after selectively removing the second sidewall spacers 132, 136 and 140. This exposes the portions of the sidewalls 117 of the raised feature 110 between the first layer 102 and the third sidewall spacers 134, between the third sidewall spacers 134 and 138, and between the third sidewall spacers 138 and 145. The third sidewall spacers 134, 138, and 145 remaining after the isotropic etch are the 3D spacers that may be used in subsequent steps such as formation of ultra-shallow dopant regions (FIGS. 12-14) or laterally etching the raised feature 110 (FIG. 15).

Figure 12:
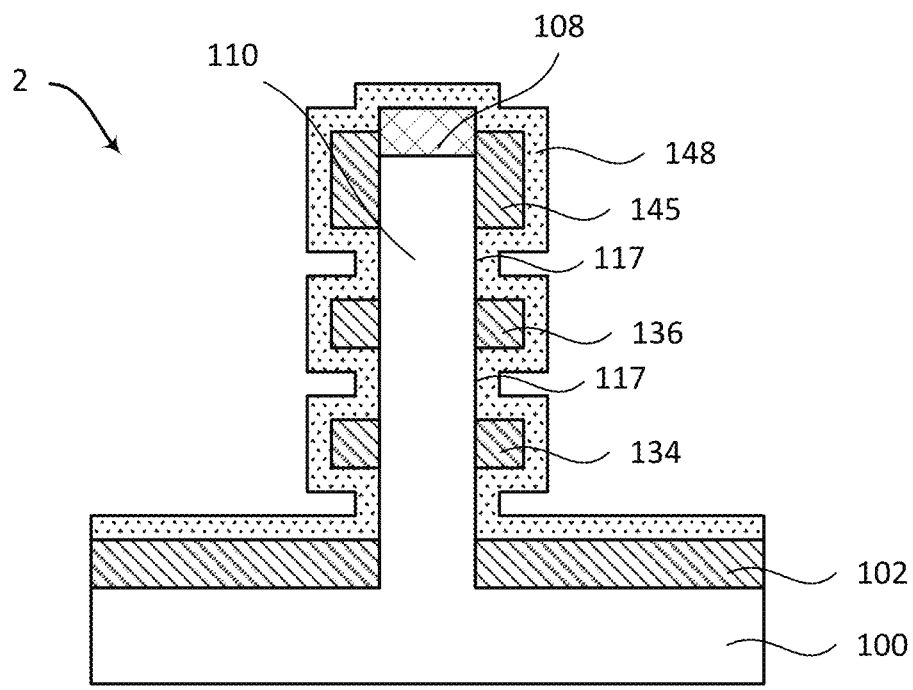

FIG. 12 illustrates the substrate 100 after depositing a dopant layer 148.

FIG. 12 illustrates the structure 2 after conformally depositing the dopant layer 148 on the structure 2, including on the sidewalls 117 of the raised feature 110. As depicted in FIG. 12, the dopant layer 148 can be in direct physical contact with the exposed sidewalls 117. In some embodiments, the dopant layer 118 may be deposited by CVD or ALD.

Figure 13:
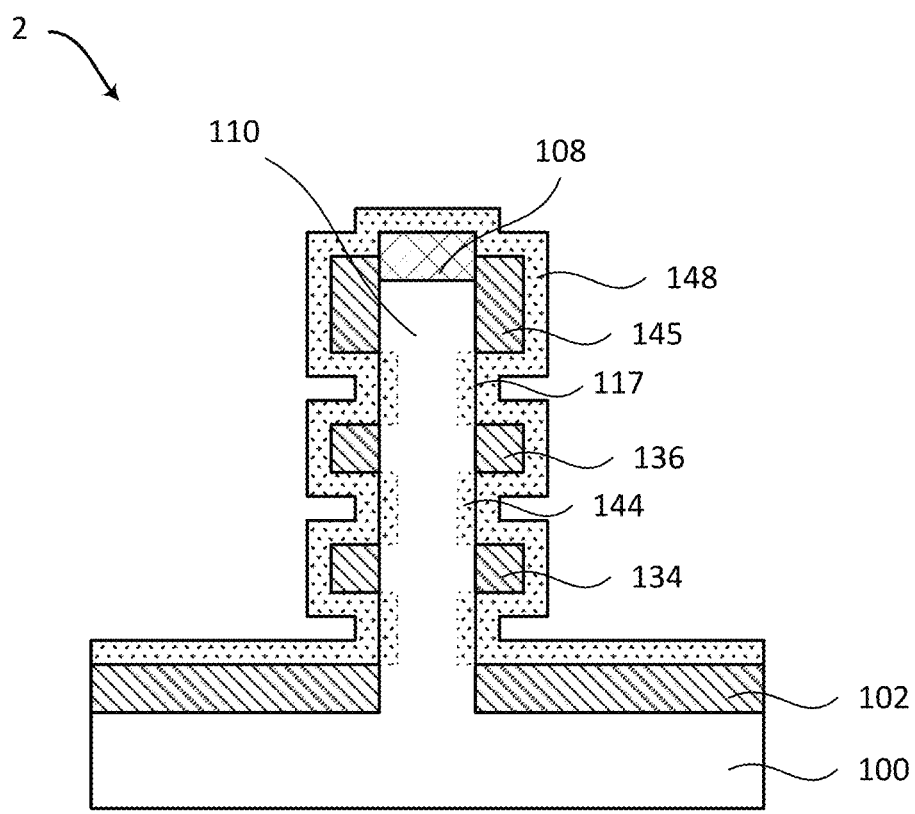

FIG. 13 illustrates the substrate 100 after a thermal treatment for solid state diffusion.

Thereafter, the structure 2 in FIG. 12 may be heat-treated to diffuse a dopant from the dopant layer 148 into the raised feature 110 through the sidewalls 117 to form dopant regions 144. This is schematically shown in FIG. 13.

Figure 14:
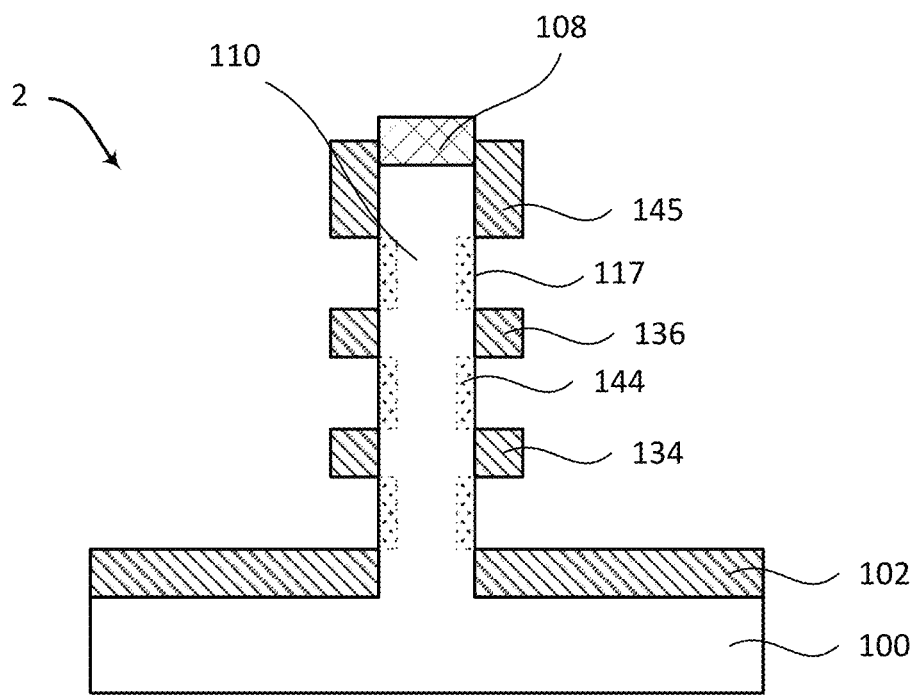
Figure 15:
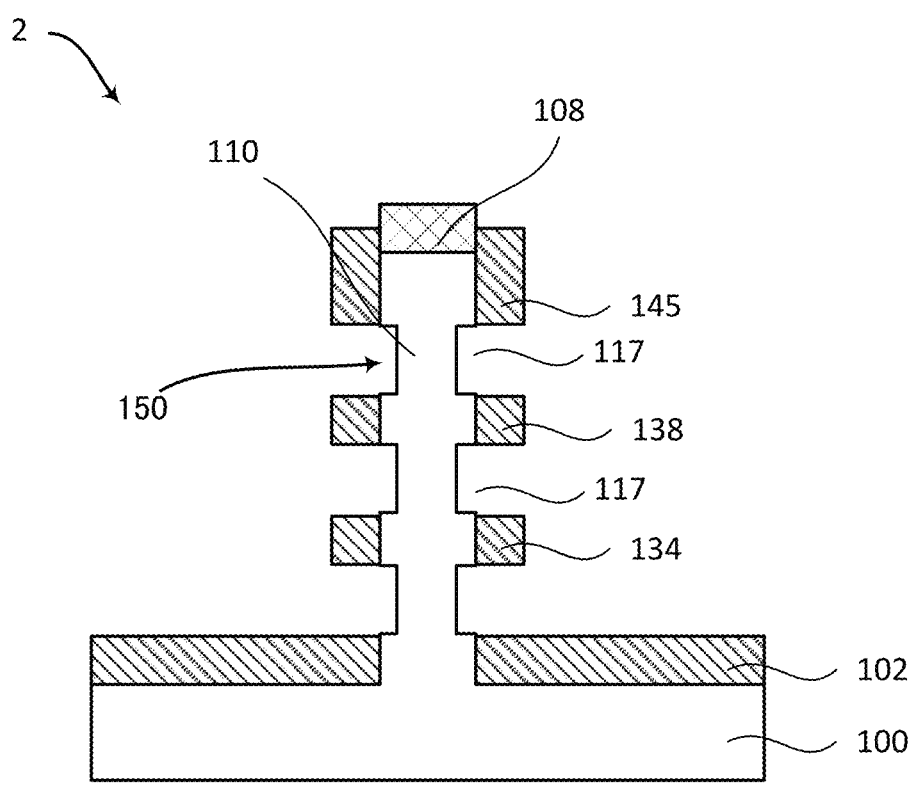
FIG. 15 schematically illustrate through cross-sectional views subsequent lateral etching of a raised feature using the sidewall spacers as an etch mask following the steps of FIG. 9-11 according to an alternate embodiment.

FIG. 14 illustrates the substrate 100 after removing the remainder of the dopant layer 148.

Following the thermal treatment, any remnants of the dopant layer 148 may be removed using a dry etching process or a wet etching process. The resulting structure is depicted in FIG. 14. Additionally, a dry or wet cleaning process may be performed to remove any etch residues from the structure 2 following the thermal treatment.

FIG. 15 schematically illustrate through cross-sectional views subsequent lateral etching of a raised feature 110 using the third sidewall spacers 134, 138, and 145 as an etch mask following the steps of FIG. 9-11 according to an alternate embodiment.

As illustrated in FIG. 15, subsequent process steps following the steps of forming 3D spacers may not be limited to the formation of the dopant regions. In certain embodiments, an isotropic etch process may be performed to etch a portion of the raised feature 110 using the 3D spacers (e.g., the third sidewall spacers 134, 138, and 145) as an etch mask and to form recesses 150. Such an etch process may enable forming steps along the sidewalls 117 of the raised feature 110.

In further embodiments, as described below, the shape of 3D spacers to be formed may be modified by introducing a gradient in chemical composition to the layers to be fabricated as the 3D spacers (e.g., the third layers 124, 128, and 135 in FIG. 9).

Figure 16:
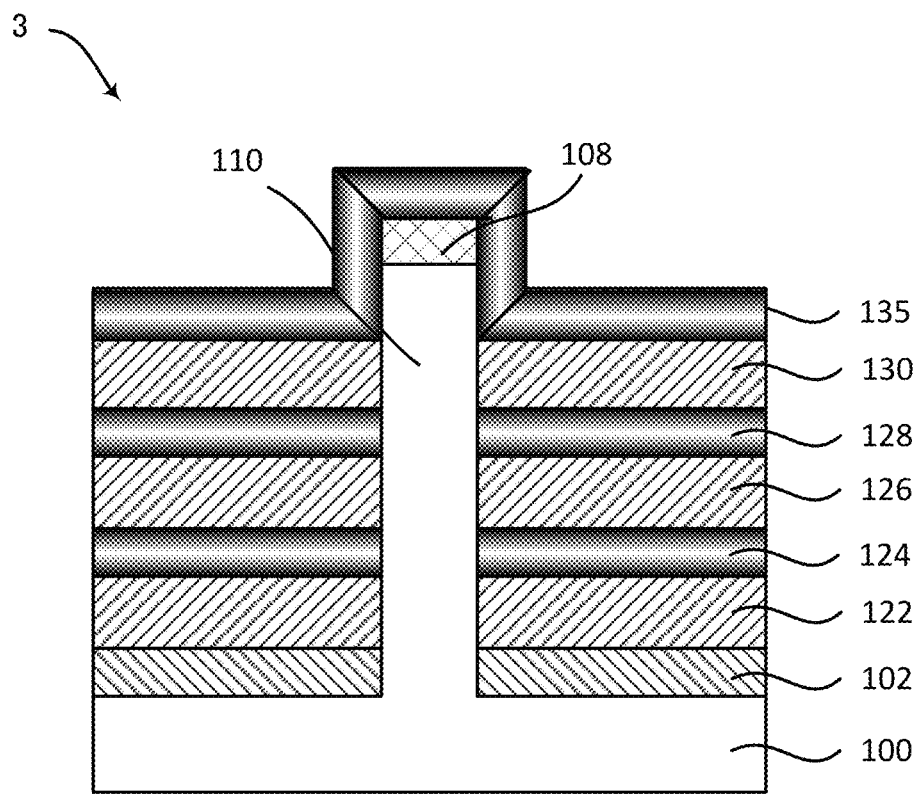
Figure 17:
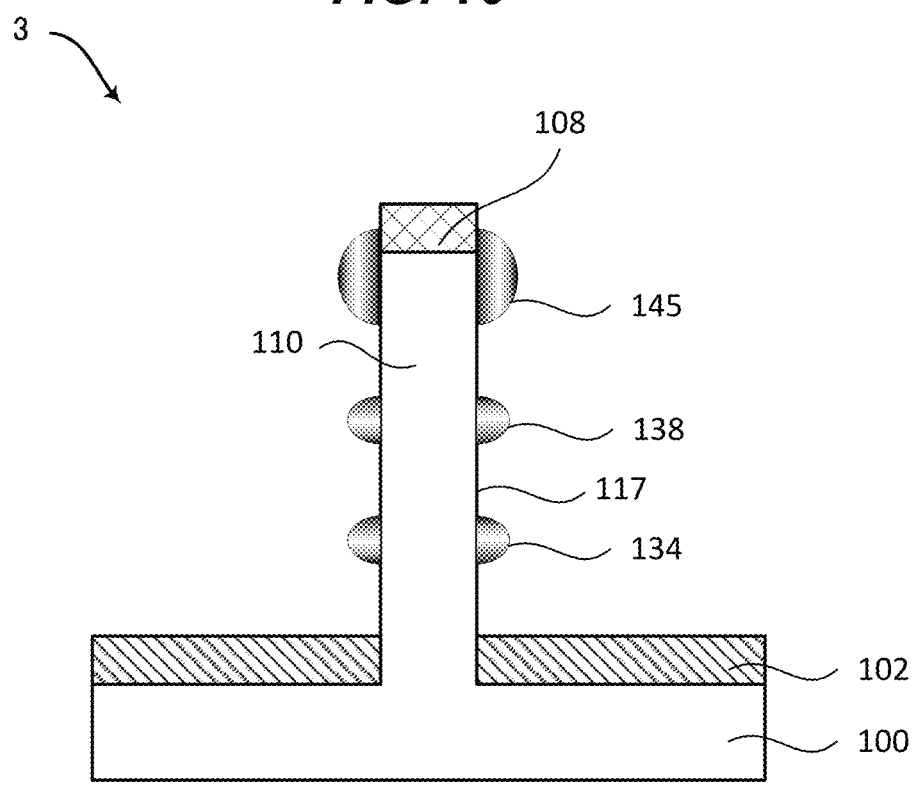
Figure 18:
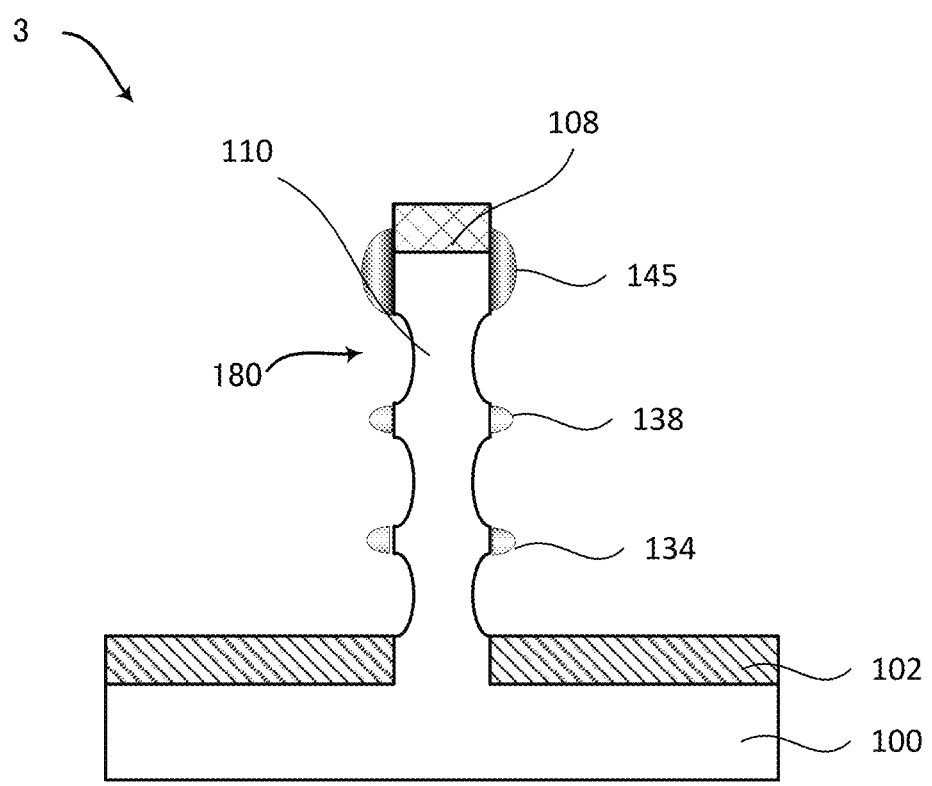

FIGS. 16-18 schematically illustrate through cross-sectional views formation of a plurality of 3D spacers according to yet another embodiment.

FIG. 16 illustrates an incoming substrate 100 having some layers with gradients in chemical composition.

In FIG. 16, a structure 3 is similar to the structure 2 described in FIG. 9 and contains a substrate 100, a raised feature 110, an optional cap layer 108 located on the top of the raised feature 110, and a first layer 102 deposited on the substrate 100 adjacent the raised feature 110. The structure 3 further include second layers 122, 126 and 130 and third layers 124, 128, and 135. In various embodiments, the second layers 122, 126, and 130 contain a second material, and third layers 124, 128 and 135 contain a third material. In general, the structure 3 may contain any number alternating second and third layers. The third material is different from the second material. In one example, the second layers 122, 126 and 130 contain silicon oxide and the third layers 124, 128 and 135 contain silicon nitride.

In various embodiments, the third layers 124, 128 and 135 may be formed by CVD or ALD that advantageously enables varying the chemical composition during the deposition. In certain embodiments, the concentration of some components of the third layers 124, 128 and 135 may gradually change in a vertical direction normal to the major surface of the substrate 100. For example, in certain embodiments, the layers 124, 128 and 135 may comprise both silicon nitride and silicon oxide, and the nitrogen concentration may have a gradient in the vertical direction. In one embodiment, the nitrogen concentration may be lowest at the bottom and the top of each of the third layers 124, 128 and 135, and highest at the middle thereof. In other embodiments, various types of gradient of chemical composition may be used.

The gradient in chemical composition may advantageously lead to different etch selectivity within each of the third layers 124, 128 and 135 during a subsequent etch process (e.g., the isotropic etch in FIGS. 5 and 11 in the prior embodiments). Consequently, the resulting sidewall spacers may advantageously have a non-uniform thickness on the sidewalls 117.

FIG. 17 illustrates the substrate after formation of the 3D spacers with varying thickness.

The substrate 100 may be etched by an anisotropic etch process and an isotropic etch process as described above (e.g., FIGS. 3-5 and 9-11) to form third sidewall spacers 134, 138, and 145. Due to the gradient in chemical composition, some portions of the third layers 124, 128, and 135 may be etched together with the second layers 122, 126, and 130 during the isotropic etch. For example, when the isotropic etch is to remove oxide materials selectively to nitride materials, the oxygen-rich portions of the third layers 124, 128, and 135 may be subject to etching while nitrogen-rich portions are not removed. This varying etch selectivity within the third layers 124, 128 and 135 may therefore result in curved shapes of the third sidewall spacers 134, 138, and 145, having a non-uniform thickness on the sidewalls 117, as illustrated in FIG. 17.

FIG. 18 illustrates the substrate 100 after a subsequent etching process.

Thereafter, an isotropic etch process may be performed to etch a portion of the raised feature 110 using the non-uniform 3D spacers (e.g., the third sidewall spacers 134, 138, and 145 in FIG. 17) as an etch mask and form recesses 180. In contrast to FIG. 15, the curved shapes of the 3D spacers may result in a corrugated shape of the etched raised feature 110. In general, the shapes of the 3D spacers may be controlled by designing a type of gradient in chemical composition of the third layers 124, 128, and 135.

FIGS. 19A-19F schematically illustrate through cross-sectional views examples of gradient in chemical composition for 3D spacers according to various embodiments.

In FIG. 19A, an initial layer deposited (e.g., one of the third layers 124, 128, or 135 in FIG. 16) may have a concentration gradient of a component such that it is lowest at the bottom and the top and highest at the middle. If a subsequent etch process is selected to be selective to this component, the resulting 3D spacer may have a semi-ellipse shape as illustrated in FIG. 19B. Similarly, in another embodiment, the initial layer may be formed to have three lowest points in concentration (e.g., at the bottom, middle, and top) and two highest points in between them (FIG. 19C), which may in turn result in a shape of two semi-ellipses (FIG. 19D). Yet in another embodiment, the initial layer may be formed with a uniform composition throughout the layer except near the bottom and top, where the concentration may sharply drops (FIG. 19E). In this case, the resulting 3D spacer may have a uniform thickness except near the bottom and top edges (FIG. 19F).

Figure 20A:
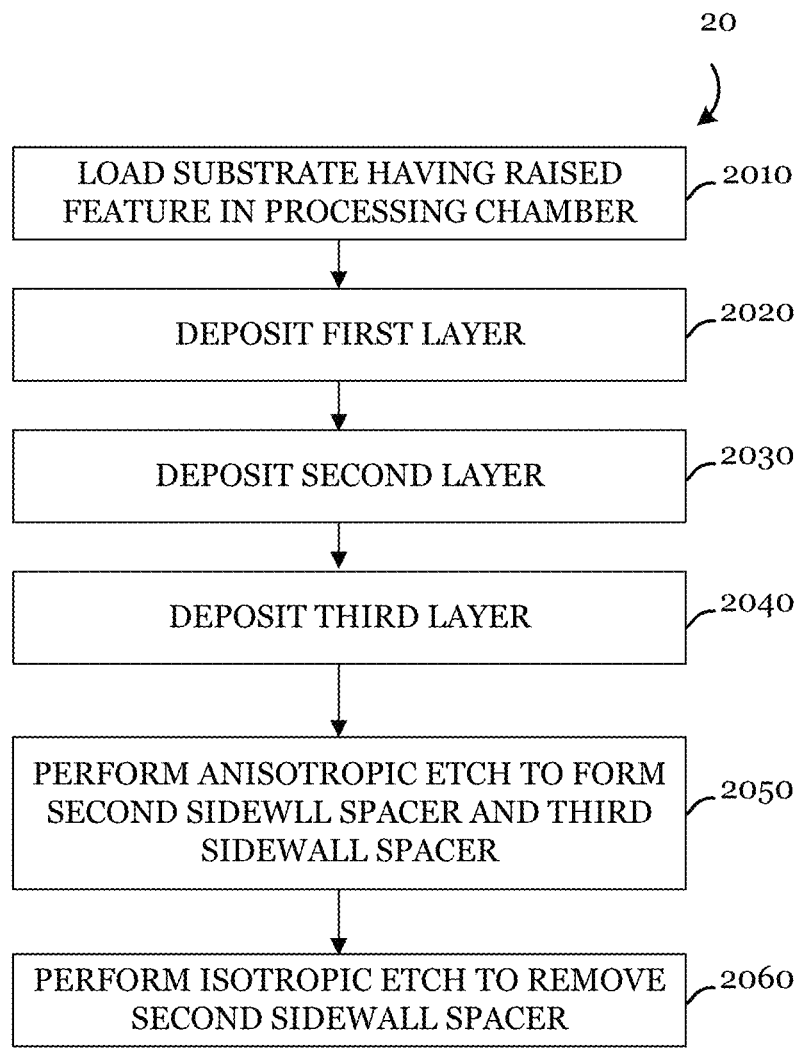
Figure 20B:
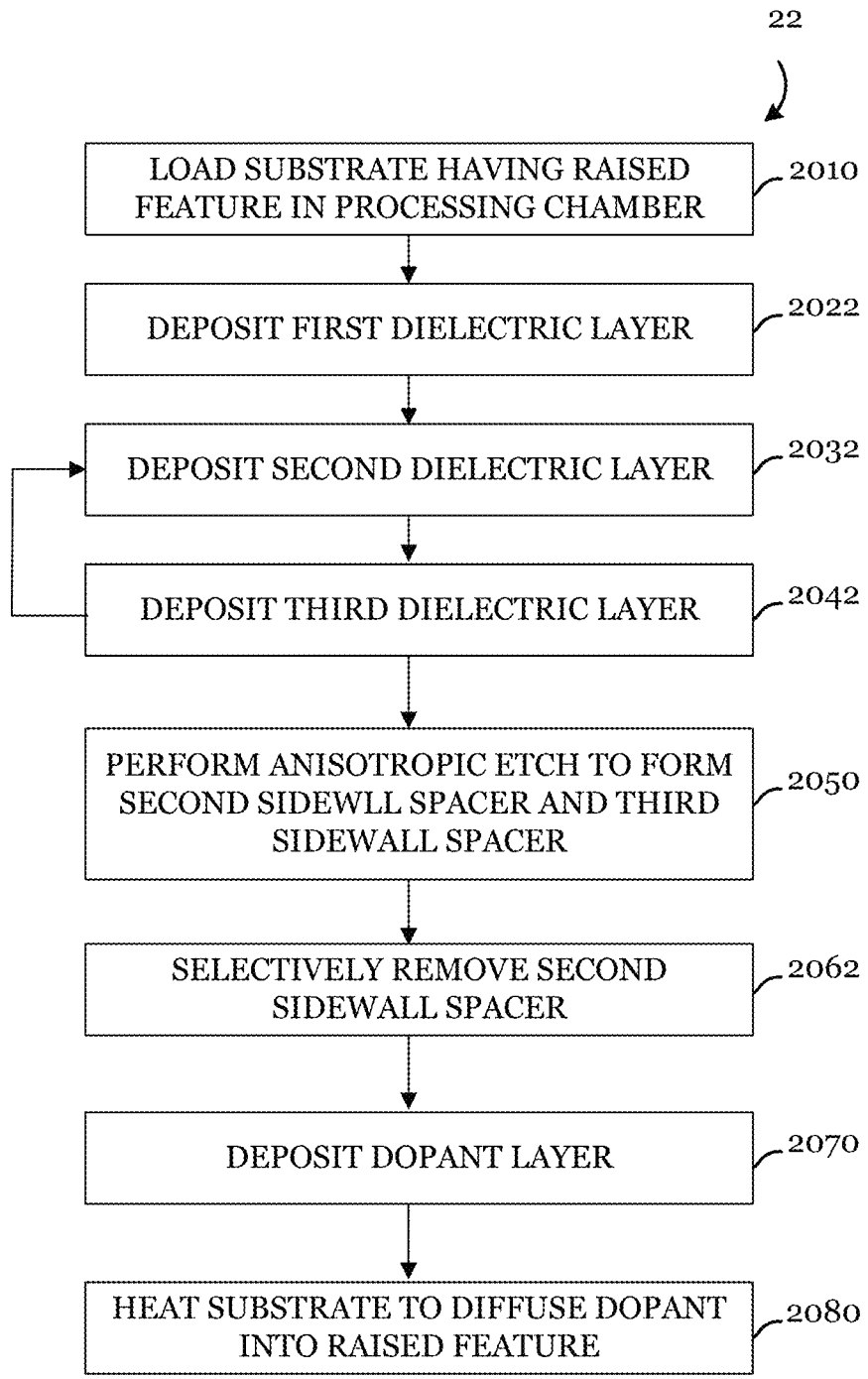
Figure 20C:
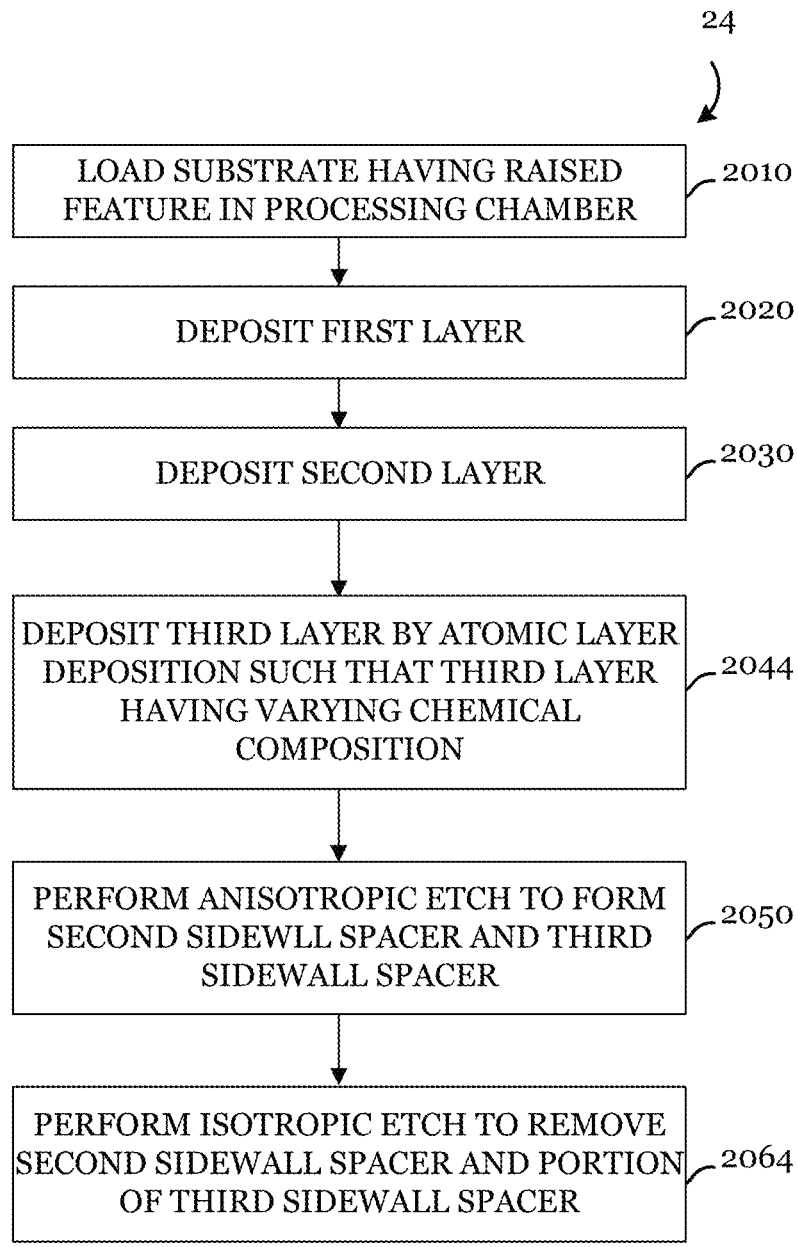

FIGS. 20A-20C illustrate process flow charts of methods of forming a 3D spacer in accordance with various embodiments. The process flow can be followed with the figures (e.g., FIGS. 1-5, 9-13, 16-17) discussed above and hence will not be described again.

In FIG. 20A, a process flow 20 starts with loading a substrate having a raised feature in a processing chamber (block 2010, FIG. 1). Next, a first layer may be deposited over the substrate adjacent the raised feature to cover a first portion of two sidewalls of the raised feature (block 2020, FIG. 2), followed by depositing a second layer over the first layer adjacent the raised feature to a second portion of the two sidewalls (block 2030, FIG. 2). A third layer may then be deposited over the second layer and the raised feature to cover a third portion of the sidewalls and a top surface of the raised feature (block 2040, FIG. 3). Subsequently, an anisotropic dry etching may be performed to remove portions of the second layer and the third layer, where a remainder of the second layer forms a second sidewall spacer and a remainder of the third layer forms a third sidewall spacer (block 2050, FIG. 4). An isotropic etching may then be performed to selectively remove the second sidewall spacer to expose portions of the sidewalls of the raised feature (block 2060, FIG. 5).

In FIG. 20B, a process flow 22 starts with loading a substrate having a raised feature with two sidewalls exposed, in a processing chamber (block 2010, FIG. 1). Next, multiple layers may be formed by depositing a first dielectric material over the substrate adjacent the raised feature to cover a first portion of the sidewalls (block 2022), depositing a second dielectric material over the first dielectric material adjacent the raised feature to cover a second portion of the sidewalls (block 2032), and depositing a third dielectric material over the second dielectric material adjacent the raised feature to cover a third portion of the sidewalls (block 2042). Further, the process proceeds to repeating steps of depositing the second dielectric material and depositing the third dielectric material (blocks 2032 and 2042) to form a layer stack of alternating layers (FIG. 9). Subsequently, an anisotropic dry etching may be performed to etch portions of the layer stack to form second sidewall spacers comprising the first dielectric material and third sidewall spacers comprising the third dielectric material (block 2050, FIG. 10), followed by selectively removing the second sidewall spacers to expose portions of the sidewalls of the raised feature (block 2062, FIG. 11). The process then proceeds to conformally depositing a dopant layer on the raised feature (block 2070, FIG. 12) and then heating the substrate to form a doped region in the raised feature by diffusion of a dopant from the dopant layer into the raised feature (block 2080, FIG. 13).

In FIG. 20C, a process flow 24 starts with loading a substrate having a raised feature in a processing chamber (block 2010, FIG. 1). Next, a first layer may be deposited over the substrate adjacent the raised feature to cover a first portion of two sidewalls of the raised feature (block 2020, FIG. 2), followed by depositing a second layer over the first layer adjacent the raised feature to a second portion of the two sidewalls (block 2030, FIG. 2). A third layer may then be deposited by atomic layer deposition (ALD) over the second layer to cover a third portion of the sidewalls, where the third layer has a varying chemical composition that changes in a vertical direction normal to a major surface of the substrate (block 2044, FIG. 16). Subsequently, an anisotropic dry etching may be performed to remove portions of the second layer and the third layer, where a remainder of the second layer forms a second sidewall spacer and a remainder of the third layer forms a third sidewall spacer (block 2050). An isotropic etching may then be performed to remove the second sidewall spacer and a portion of the third sidewall spacer to expose portions of the sidewalls of the raised feature (block 2064, FIG. 17).

Example embodiments of the invention are summarized here. Other embodiments can also be understood from the entirety of the specification as well as the claims filed herein.

Example 1. A method of processing a substrate that includes: loading the substrate in a processing chamber, the substrate having a raised feature with at least two sidewalls exposed on a surface of the raised feature; depositing a first layer over the substrate adjacent the raised feature, the first layer covering a first portion of the two sidewalls; depositing a second layer over the first layer adjacent the raised feature, the second layer covering a second portion of the two sidewalls, where the first layer and the second layer include different materials; depositing a third layer over the second layer and the raised feature, the third layer covering a third portion of the sidewalls and a top surface of the raised feature, where the second layer and the third layer include different materials; performing an anisotropic dry etching that removes portions of the second layer and the third layer, a remainder of the second layer forming a second sidewall spacer and a remainder of the third layer forming a third sidewall spacer; and performing an isotropic etching that selectively removes the second sidewall spacer to expose portions of the sidewalls of the raised feature.

Example 2. The method of example 1, further including: after performing the isotropic etching, conformally depositing a dopant layer over the raised feature, the dopant layer being in physical contact with the exposed portions of the sidewalls of the raised feature; and heating the substrate to form a doped region in the raised feature by diffusion of a dopant from the dopant layer into the raised feature.

Example 3. The method of one of examples 1 or 2, further including, removing the dopant layer following the heating.

Example 4. The method of one of examples 1 to 3, further including, after performing the isotropic etching, performing another isotropic etching that etches the raised feature selectively to the third sidewall spacer.

Example 5. The method of one of examples 1 to 4, where the second and third layers include silicon oxide, silicon nitride, silicon carbide, spin-on carbon, or spin-on polymer.

Example 6. The method of one of examples 1 to 5, where the second layer includes silicon oxide and the third layer includes silicon nitride.

Example 7. The method of one of examples 1 to 6, where the first layer includes silicon nitride.

Example 8. The method of one of examples 1 to 7, where the selectively removing the second layer includes an isotropic dry etching process.

Example 9. The method of one of examples 1 to 8, where the raised feature includes a fin structure and a hardmask covering a top surface of the fin structure.

Example 10. A method of forming a 3D spacer for a semiconductor device that includes: loading a substrate having a raised feature in a processing chamber, the raised feature including two exposed sidewalls; depositing a first dielectric material over the substrate adjacent the raised feature to cover a first portion of the sidewalls; depositing a second dielectric material over the first dielectric material adjacent the raised feature to cover a second portion of the sidewalls; depositing a third dielectric material over the second dielectric material adjacent the raised feature to cover a third portion of the sidewalls; forming a layer stack by repeating steps of depositing the second dielectric material and depositing the third dielectric material; performing an anisotropic dry etching that etches portions of the layer stack to form second sidewall spacers including the first dielectric material and third sidewall spacers including the third dielectric material; selectively removing the second sidewall spacers to expose portions of the sidewalls of the raised feature; conformally depositing a dopant layer on the raised feature, the dopant layer being in physical contact with the exposed portions of the sidewalls of the raised feature; and heating the substrate to form a doped region in the raised feature by diffusion of a dopant from the dopant layer into the raised feature.

Example 11. The method of example 10, where the second dielectric material and the third dielectric material include different materials, and include silicon oxide, silicon nitride, silicon carbide, spin-on carbon, or spin-on polymer.

Example 12. The method of one of examples 10 or 11, where the second dielectric material include silicon oxide and the third dielectric material includes silicon nitride.

Example 13. The method of one of examples 10 to 12, where the first and third dielectric materials include a same material.

Example 14. The method of one of examples 10 to 13, where one of the second sidewall spacers or one of the third sidewall spacers has a height between about 5 nm and about 15 nm.

Example 15. The method of one of examples 10 to 14, where the anisotropic dry etching is terminated when a top surface of the first dielectric material is exposed.

Example 16. The method of one of examples 10 to 15, where forming the layer stack further includes removing the second dielectric material or the third dielectric material.

Example 17. A method of processing a substrate that includes: loading the substrate in a processing chamber, the substrate having a raised feature with at least two sidewalls exposed on a surface of the raised feature; depositing a first layer over the substrate adjacent the raised feature, the first layer covering a first portion of the two sidewalls; depositing a second layer over the first layer adjacent the raised feature, the second layer covering a second portion of the two sidewalls, where the first layer and the second layer include different materials; depositing a third layer, using atomic layer deposition (ALD), over the second layer, the third layer covering a third portion of the sidewalls, the third layer having a varying chemical composition that changes in a vertical direction normal to a major surface of the substrate; performing an anisotropic dry etching that removes portions of the second layer and the third layer, a remainder of the second layer forming a second sidewall spacer and a remainder of the third layer forming a third sidewall spacer; and performing an isotropic etching that removes the second sidewall spacer and a portion of the third sidewall spacer to expose portions of the sidewalls of the raised feature.

Example 18. The method of example 17, where the second layer includes silicon oxide and the third layer includes silicon oxide and silicon nitride, and where a ratio of silicon nitride to silicon oxide in the third layer changes in the vertical direction.

Example 19. The method of one of examples 17 or 18, where the third sidewall spacer has an even thickness in the vertical direction.

Example 20. The method of one of examples 17 to 19, where the third sidewall spacer is thinner at a bottom portion or a top portion than a middle portion.

Example 21. The method of one of examples 1 to 8, where the raised feature includes
Si or SiGe.

Example 22. The method of one of examples 1 to 8, where the first and third layers contain the same material.

Example 23. The method of one of examples 1 to 8, where the dopant layer contains a p-type dopant or a n-type dopant.

Example 24. The method of one of examples 10 to 16, where the raised feature includes Si, SiGe, or both Si and SiGe.

Example 25. The method of one of examples 10 to 16, where the second and third layers contain different materials.

Example 26. The method of one of examples 10 to 16, where the dopant layer contains a p-type dopant or a n-type dopant.

Example 27. The method of one of examples 10 to 16, where the selectively removing the second layers includes an isotropic dry etching process.

Example 28. The method of one of examples 10 to 16, further including removing the dopant layer following heating the substrate.

Example 29. A semiconductor device, including: a raised feature on a substrate; one or more sidewall spacers on the raised feature, where the one or more sidewall spacers are separated by gaps that expose a sidewall of the raised feature; and a doped region in the raised feature between the one or more sidewall spaces.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A method of processing a substrate, the method comprising:
   loading the substrate in a processing chamber, the substrate having a raised feature with at least two sidewalls exposed on a surface of the raised feature;
   depositing a first layer over the substrate adjacent to the raised feature, the first layer covering a first portion of the at least two sidewalls;
   depositing a second layer over the first layer adjacent to the raised feature, the second layer covering a second portion of the at least two sidewalls, wherein the first layer and the second layer comprise different materials;
   depositing a third layer over the second layer and the raised feature, the third layer covering a third portion of the at least two sidewalls and a top surface of the raised feature, wherein the second layer and the third layer comprise different materials;

performing an anisotropic dry etching that removes portions of the second layer and the third layer, a remainder of the second layer forming a second sidewall spacer and a remainder of the third layer forming a third sidewall spacer; and performing an isotropic etching that selectively removes the second sidewall spacer to expose portions of the at least two sidewalls of the raised feature.

2. The method of claim 1, wherein the second and third layers comprise silicon oxide, silicon nitride, silicon carbide, spin-on carbon, or spin-on polymer.

3. The method of claim 1, wherein the second layer comprises silicon oxide and the third layer comprises silicon nitride.

4. The method of claim 1, wherein the first layer comprises silicon nitride.

5. The method of claim 1, wherein the selectively removing the second layer comprises an isotropic dry etching process.

6. The method of claim 1, wherein the raised feature comprises a fin structure and a hardmask covering a top surface of the fin structure.

7. A method of processing a substrate, the method comprising:
    loading the substrate in a processing chamber, the substrate having a raised feature with at least two sidewalls exposed on a surface of the raised feature;
    depositing a first layer over the substrate adjacent to the raised feature, the first layer covering a first portion of the at least two sidewalls;
    depositing a second layer over the first layer adjacent to the raised feature, the second layer covering a second portion of the at least two sidewalls, wherein the first layer and the second layer comprise different materials;
    depositing a third layer over the second layer and the raised feature, the third layer covering a third portion of the at least two sidewalls and a top surface of the raised feature, wherein the second layer and the third layer comprise different materials;
    performing an anisotropic dry etching that removes portions of the second layer and the third layer, a remainder of the second layer forming a second sidewall spacer and a remainder of the third layer forming a third sidewall spacer; and
    performing an isotropic etching that selectively removes the second sidewall spacer to expose portions of the at least two sidewalls of the raised feature;
    after performing the isotropic etching, conformally depositing a dopant layer over the raised feature, the dopant layer being in physical contact with the exposed portions of the at least two sidewalls of the raised feature; and
    heating the substrate to form a doped region in the raised feature by diffusion of a dopant from the dopant layer into the raised feature.

8. The method of claim 7, further comprising removing the dopant layer following the heating.

9. The method of claim 7, wherein the second and third layers comprise silicon oxide, silicon nitride, silicon carbide, spin-on carbon, or spin-on polymer.

10. The method of claim 7, wherein the second layer comprises silicon oxide and the third layer comprises silicon nitride.

11. The method of claim 7, wherein the first layer comprises silicon nitride.

12. The method of claim 7, wherein the raised feature comprises a fin structure and a hardmask covering a top surface of the fin structure.

13. A method of processing a substrate, the method comprising:
    loading the substrate in a processing chamber, the substrate having a raised feature with at least two sidewalls exposed on a surface of the raised feature;
    depositing a first layer over the substrate adjacent to the raised feature, the first layer covering a first portion of the at least two sidewalls;
    depositing a second layer over the first layer adjacent to the raised feature, the second layer covering a second portion of the at least two sidewalls, wherein the first layer and the second layer comprise different materials;
    depositing a third layer over the second layer and the raised feature, the third layer covering a third portion of the at least two sidewalls and a top surface of the raised feature, wherein the second layer and the third layer comprise different materials;
    performing an anisotropic dry etching that removes portions of the second layer and the third layer, a remainder of the second layer forming a second sidewall spacer and a remainder of the third layer forming a third sidewall spacer; and
    performing an isotropic etching that selectively removes the second sidewall spacer to expose portions of the at least two sidewalls of the raised feature; and
    after performing the isotropic etching, performing another isotropic etching that etches the raised feature selectively to the third sidewall spacer.

14. The method of claim 13, wherein the second and third layers comprise silicon oxide, silicon nitride, silicon carbide, spin-on carbon, or spin-on polymer.

15. The method of claim 13, wherein the second layer comprises silicon oxide and the third layer comprises silicon nitride.

16. The method of claim 13, wherein the first layer comprises silicon nitride.

17. The method of claim 13, wherein the raised feature comprises a fin structure and a hardmask covering a top surface of the fin structure.

* * * * *